US009018666B2

(12) United States Patent
Choi et al.

(10) Patent No.: US 9,018,666 B2
(45) Date of Patent: *Apr. 28, 2015

(54) SEMICONDUCTOR LIGHT EMITTING DEVICE

(75) Inventors: Pun Jae Choi, Gyunggi-do (KR); Ki Yeol Park, Daegu (KR); Sang Bum Lee, Gyunggi-do (KR); Seon Young Myoung, Gyunggi-do (KR); Myong Soo Cho, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/728,853

(22) Filed: Mar. 22, 2010

(65) Prior Publication Data

US 2010/0171140 A1 Jul. 8, 2010

Related U.S. Application Data

(62) Division of application No. 12/003,886, filed on Jan. 3, 2008.

(30) Foreign Application Priority Data

Feb. 13, 2007 (KR) .......................... 10-2007-0014844

(51) Int. Cl.
*H01L 33/00* (2010.01)
*H01L 33/38* (2010.01)
*H01L 33/20* (2010.01)

(52) U.S. Cl.
CPC ............... *H01L 33/382* (2013.01); *H01L 33/20* (2013.01)

(58) Field of Classification Search
CPC ....................................................... H01L 33/382
USPC .............................. 257/99, E33.065, E33.062
See application file for complete search history.

(56) References Cited

U.S. PATENT DOCUMENTS 6,201,265 B1 3/2001 Teraguchi
6,255,129 B1 7/2001 Lin
(Continued)

FOREIGN PATENT DOCUMENTS

DE          100 26 255 A1   11/2001
DE    10 2007 022 947 A1   10/2008
(Continued)

OTHER PUBLICATIONS

Machine translation of Rin et al. (JP 2005322722 A).*
(Continued)

*Primary Examiner* — Hsin-Yi Hsieh
(74) *Attorney, Agent, or Firm* — McDermott Will & Emery LLP

(57) ABSTRACT

There is provided a semiconductor light emitting device that minimizes reflection or absorption of emitted light, maximizes luminous efficiency with the maximum light emitting area, enables uniform current spreading with a small area electrode, and enables mass production with high reliability and high quality. A semiconductor light emitting device according to an aspect of the invention includes first and second conductivity type semiconductor layers, an active layer formed therebetween, first electrode layer, and a second electrode part electrically connecting the semiconductor layers. The second electrode part includes an electrode pad unit, an electrode extending unit, and an electrode connecting unit connecting the electrode pad unit and electrode extending unit.

15 Claims, 11 Drawing Sheets

(56) References Cited

U.S. PATENT DOCUMENTS

| | | |
|---|---|---|
| 6,459,100 B1 | 10/2002 | Doverspike et al. |
| 6,828,596 B2 | 12/2004 | Steigerwald et al. |
| 7,183,579 B2 | 2/2007 | Chae et al. |
| 2003/0230754 A1 | 12/2003 | Steigerwald et al. |
| 2004/0227148 A1 | 11/2004 | Camras et al. |
| 2005/0012109 A1 | 1/2005 | Kohno et al. |
| 2005/0056855 A1 | 3/2005 | Lin et al. |
| 2005/0104081 A1 | 5/2005 | Kim et al. |
| 2006/0071228 A1* | 4/2006 | Sun .................................. 257/99 |
| 2006/0220031 A1 | 10/2006 | Krames et al. |
| 2007/0023815 A1 | 2/2007 | Oh et al. |
| 2007/0114564 A1 | 5/2007 | Lee et al. |
| 2007/0181895 A1 | 8/2007 | Nagai |
| 2008/0083929 A1 | 4/2008 | Fan et al. |
| 2008/0179605 A1 | 7/2008 | Takase et al. |
| 2008/0191215 A1 | 8/2008 | Choi et al. |
| 2008/0237622 A1 | 10/2008 | Choi et al. |
| 2008/0277674 A1 | 11/2008 | Nagai et al. |
| 2008/0303055 A1 | 12/2008 | Seong |
| 2009/0065800 A1 | 3/2009 | Wirth et al. |
| 2009/0101923 A1 | 4/2009 | Choi et al. |
| 2009/0173952 A1 | 7/2009 | Takeuchi et al. |

FOREIGN PATENT DOCUMENTS

| | | |
|---|---|---|
| JP | 2001-148511 | 5/2001 |
| JP | 2003-229638 | 8/2003 |
| JP | 2003-347653 | 12/2003 |
| JP | 2004-047988 | 2/2004 |
| JP | 2004-047988 A | 2/2004 |
| JP | 2004-297097 | 10/2004 |
| JP | 2004-297097 A | 10/2004 |
| JP | 2005-150675 | 6/2005 |
| JP | 2005-150675 A | 6/2005 |
| JP | 2005-322722 | 11/2005 |
| JP | 2007-036571 | 2/2007 |
| JP | 2007-36260 | 7/2007 |
| JP | 2007-523483 | 8/2007 |
| KR | 10-2005-0068807 A | 7/2005 |
| KR | 10-2006-0010527 | 2/2006 |
| KR | 10-2006-0112872 A | 11/2006 |
| WO | WO 2007/074969 A1 | 7/2007 |

OTHER PUBLICATIONS

United States Office Action issued in U.S. Appl. No. 12/003,886 dated Apr. 26, 2010.

Japanese Office Action, w/ English translation thereof, issued in Japanese Patent Application No. JP 2008-005015 dated Mar. 16, 2010.

United States Office Action issued in U.S. Appl. No. 12/189,428 dated Apr. 26, 2010.

United States Office Action issued in U.S. Appl. No. 12/189,428, mailed Nov. 17, 2010.

Japanese Office Action, with English translation, issued in Japanese Patent Application No. 2008-005015, dated Jan. 4, 2011.

United States Office Action issued in U.S. Appl. No. 12/003,886, mailed on Feb. 16, 2011.

U.S. Office Action issued in U.S. Appl. No. 12/003,886, dated Sep. 30, 2011.

Japanese Office Action, w/ English translation thereof, issued in Japanese Patent Application No. JP 2010-038253 dated Feb. 5, 2013.

United States Office Action issued in U.S. Appl. No. 12/003,886 dated Jul. 3, 2012.

US Office Action issued in U.S. Appl. No. 13/213,988 dated May 4, 2012.

Notice of Allowance U.S. Appl. No. 12/003,886 dated Jul. 3, 2014.

Machine translation of Rin et al. (JP2005322722 A), Date: Nov. 17, 2005.

* cited by examiner

SEMICONDUCTOR LIGHT EMITTING DEVICE

CROSS-REFERENCE TO RELATED APPLICATIONS

This application is a Divisional of U.S. application Ser. No. 12/003,886, filed on Jan. 3, 2008, claiming priority of Korean Patent Application No. 10-2007-0014844, filed on Feb. 13, 2007, the entire contents of each of which are hereby incorporated by reference.

BACKGROUND OF THE INVENTION

1. Field of the Invention

The present invention relates to a semiconductor light emitting device, and more particularly, to a semiconductor light emitting device that minimizes reflection or absorption of emitted light, maximizes luminous efficiency with the maximum light emitting area, enables uniform current spreading with a small area electrode, and enables mass production with high reliability and high quality.

2. Description of the Related Art

Semiconductor light emitting devices include materials that emit light. For example, light emitting diodes (LEDs) are devices that use diodes, to which semiconductors are bonded, convert energy generated by combination of electrons and holes into light, and emit light. The semiconductor light emitting devices are being widely used as lighting, display devices, and light sources, and development of the semiconductor light emitting device has been expedited.

In particular, the widespread use of cellular phone keypads, side viewers, and camera flashes, which use GaN-based light emitting diodes that have been actively developed and widely used in recent years, contributed to the active development of general illumination that uses light emitting diodes. Applications of the light emitting diodes, such as backlight units of large TVs, headlights of cars, and general illumination have advanced from small portable products to large products having high power, high efficiency, and high reliability. Therefore, there has been a need for light sources that have characteristics required for the corresponding products.

In general, a semiconductor junction semiconductor light emitting device has P-type and n-type semiconductor junction structures. In the semiconductor junction structure, light may be emitted by recombination of electrons and holes at a region where the two types of semiconductors are bonded to each other. In order to activate the light emission, an active layer may be formed between the two semiconductors. The semiconductor light emitting device having the semiconductor junctions includes a horizontal structure and a vertical structure according to the position of electrodes for semiconductor layers. The vertical structure includes an epi-up structure and a flip-chip structure. As described above, structural characteristics of semiconductor light emitting devices that are required according to characteristics of individual products are seriously taken into account.

FIG. 1A is a view illustrating a horizontal semiconductor light emitting device according to the related art. FIG. 1B is a view illustrating a vertical semiconductor light emitting device according to the related art. FIG. 1C is a cross-sectional view illustrating a vertical semiconductor light emitting device according to the related art. For the convenience of explanation, in FIGS. 1A to 1C, a description will be made on the assumption that an n-type semiconductor layer is in contact with a substrate, and a p-type semiconductor layer is formed on an active layer.

First, a horizontal semiconductor light emitting device will be described with reference to FIG. 1A.

A semiconductor light emitting device 1 includes a non-conductive substrate 13, an n-type semiconductor layer 12, an active layer 1, and a p-type semiconductor layer 10. An n-type electrode 15 and a p-type electrode 14 are formed on the n-type semiconductor layer 12 and the p-type semiconductor layer 10, respectively, and, are connected to an external current source (not shown) to apply a voltage.

When a voltage is applied to the semiconductor light emitting device 1 through the electrodes 14 and 15, electrons move from the n-type semiconductor layer 12, and holes move from the p-type semiconductor layer 10. Light is emitted by recombination of the electrons and the holes. The semiconductor light emitting device 1 includes the active layer 1, and light is emitted from the active layer 1. In the active layer 1, the light emission of the semiconductor light emitting device 1 is activated, and light is emitted. In order to make an electrical connection, the n-type electrode and the p-type electrode are located on the n-type semiconductor layer 12 and the p-type semiconductor layer 10, respectively, with the lowest contact resistance values.

The position of the electrode may be changed according to the substrate type. For example, when the substrate 13 is a sapphire substrate that is a non-conductive substrate, the electrode of the n-type semiconductor layer 12 cannot be formed on the non-conductive substrate 13, but on the n-type semiconductor layer 12.

Therefore, referring to FIG. 1A, when the n-type electrode 15 is formed on the n-type semiconductor 12, parts of the p-type semiconductor layer 10 and the active layer 11 that are formed at the upper side are consumed to form an ohmic contact. The formation of the electrode results in a decrease of light emitting area of the semiconductor light emitting device 1, and thus luminous efficiency also decreases.

In order to solve a variety of problems including the above-described problems, a semiconductor light emitting device that uses a conductive substrate, not the non-conductive substrate, appeared. A semiconductor light emitting device 2, shown in FIG. 1B, is a vertical semiconductor light emitting device. When a conductive substrate 23 is used, an n-type electrode 25 may be formed on the conductive substrate 23. In FIG. 1B, the n-type electrode is formed on the conductive substrate 23. Alternatively, after semiconductor layers grow by using a non-conductive substrate, the non-conductive substrate is removed. Then, an n-type electrode is directly formed on the n-type semiconductor layer, thereby manufacturing a vertical semiconductor light emitting device.

When the conductive substrate 23 is used, since a voltage can be applied to an n-type semiconductor layer 22 and the active layer 21 through the conductive substrate 23, an electrode can be directly formed on the substrate. Therefore, as shown in FIG. 1B, the n-type electrode 25 is formed on the conductive substrate 23, and a p-type electrode 24 is formed on a p-type semiconductor 20, a semiconductor light emitting device having a vertical structure can be manufactured.

However, when a high-power semiconductor light emitting device having a large area is manufactured, an area ratio of the electrode to the substrate needs to be high for current spreading. Therefore, light extraction is limited, light loss is caused by optical absorption, and luminous efficiency decreases.

In FIG. 1C, a horizontal semiconductor light emitting device has a structure that increases luminous efficiency. The semiconductor light emitting device 3, shown in FIG. 1C, is a flip chip semiconductor light emitting device. A substrate 33 is located at the top. Electrodes 34 and 35 are in contact with electrode contacts 36 and 37, respectively, which are formed on a conductive substrate 38. Light emitted from an active layer 31 disposed between an n-type semiconductor layer 32 and a p-type semiconductor layer 30 is emitted through the substrate 33 regardless of the electrodes 34 and 35. Therefore, the decrease in luminous efficiency that is caused in the semiconductor light emitting device, shown in FIGS. 1A and 1B, can be prevented.

However, despite the high luminous efficiency of the horizontal semiconductor light emitting device, the n-type electrode and the p-type electrode in the semiconductor light emitting device need to be disposed in the same plane and bonded. After being bonded, the n-type electrode and the p-type electrode are more likely to be separated from the electrode contacts 36 and 37. For this reason, there is a need for expensive precision processing equipment. This causes an increase in manufacturing costs, a decrease in productivity, a decrease in yield, and a decrease in product reliability.

SUMMARY OF THE INVENTION

An aspect of the present invention provides a semiconductor light emitting device that minimizes reflection or absorption of emitted light, maximizes luminous efficiency with the maximum light emitting area, enables uniform current spreading with a small area electrode, and enables mass production with high reliability and high quality.

According to an aspect of the present invention, there is provided a semiconductor light emitting device having a conductive substrate, a first conductivity type semiconductor layer, an active layer, and a second conductivity type semiconductor layer sequentially laminated, the semiconductor light emitting device including: a first electrode layer formed between the conductive substrate and the first conductivity type semiconductor layer; and a second electrode part including at least one electrode pad unit extending from the first electrode layer to the surface of the second conductivity type semiconductor layer, and electrically insulated from the first electrode layer, the first conductivity type semiconductor layer, and the active layer, at least one electrode extending unit extending unit extending from the first electrode layer to the inside of the second conductivity type semiconductor layer, and electrically insulated from the first electrode layer, the first conductivity type semiconductor layer, and the active layer, and an electrode connecting unit formed on the same layer as the first electrode layer, electrically separated from the first electrode layer, and connecting the electrode pad unit and the electrode extending unit.

A cross-section of the electrode pad unit crossing the active layer may be smaller than that of the electrode pad unit crossing the second conductivity type semiconductor layer.

The electrode connecting unit may include a plurality of electrode connecting units. The plurality of electrode extending units may be directly connected to the electrode pad unit by the electrode connecting unit. At least one of the plurality of electrode extending units may be connected to the electrode pad unit by the electrode extending unit connected to the electrode pad unit. The electrode extending unit may be separated from the electrode pad unit by a predetermined distance.

A cross section of the electrode extending unit crossing the active layer may be smaller than that of the electrode pad unit crossing the active layer.

The first electrode layer may reflect light generated from the active layer. The first electrode layer may include any one of Ag, Al, and Pt.

Each of the first conductivity type semiconductor layer and the second conductivity type semiconductor layer may be formed of a GaN-based compound semiconductor. The active layer may be formed of a InxAlyGa(1-x-y)N (here, $0 \le x \le 1$, $0 \le y \le 1$, and $0 \le x+y \le 1$)-based compound semiconductor.

The irregular pattern may be formed on the second conductivity type semiconductor layer. The second conductivity type semiconductor layer may have a photonic crystal structure.

The conductive substrate may be a metallic substrate. The metallic substrate may include any one of Au, Ni, Cu, and W. The conductive substrate may be a semiconductor substrate. The semiconductor substrate may include any one of Si, Ge, and GaAs. The conductive substrate may be formed by a plating method or a substrate bonding method.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1A:
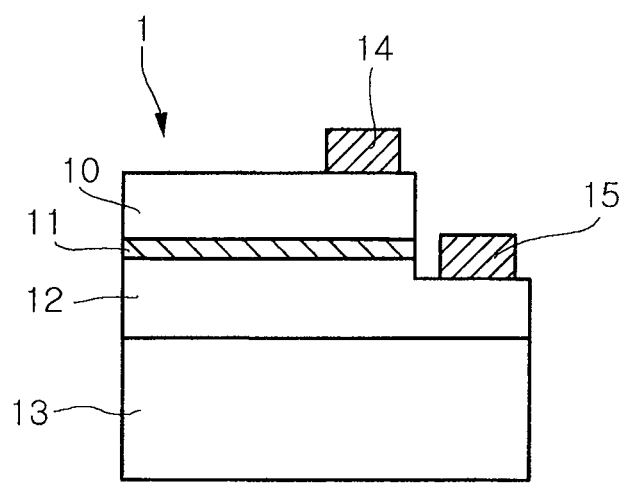
FIG. 1A is a cross-sectional view illustrating a horizontal semiconductor light emitting device according to the related art.
Figure 1B:
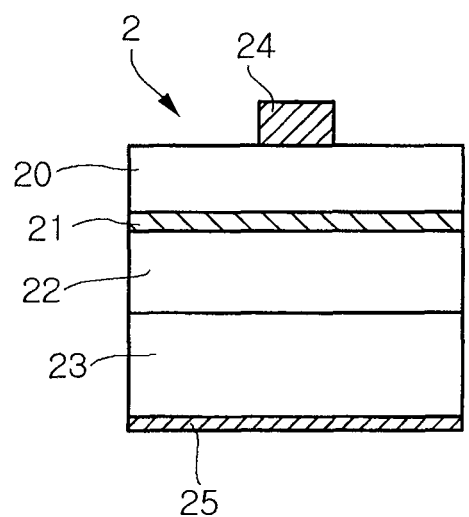
FIG. 1B is a cross-sectional view illustrating a vertical semiconductor light emitting device according to the related art.
Figure 1C:
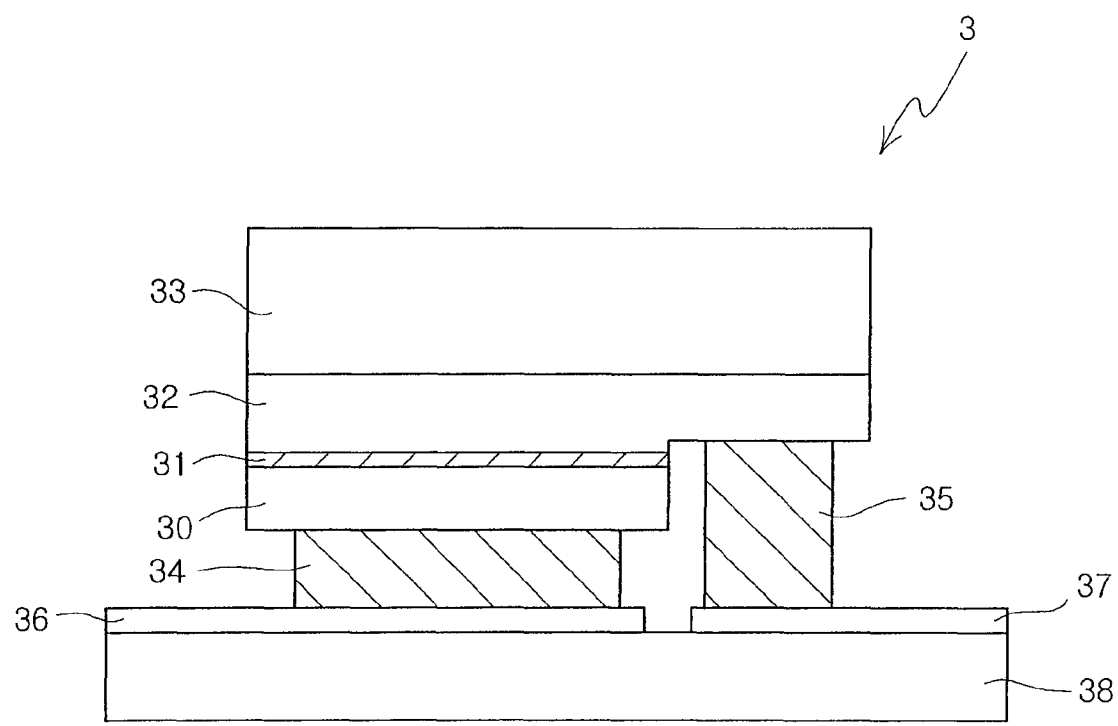
FIG. 1C is a cross-sectional view illustrating a horizontal semiconductor light emitting device according to the related art.
Figure 2:
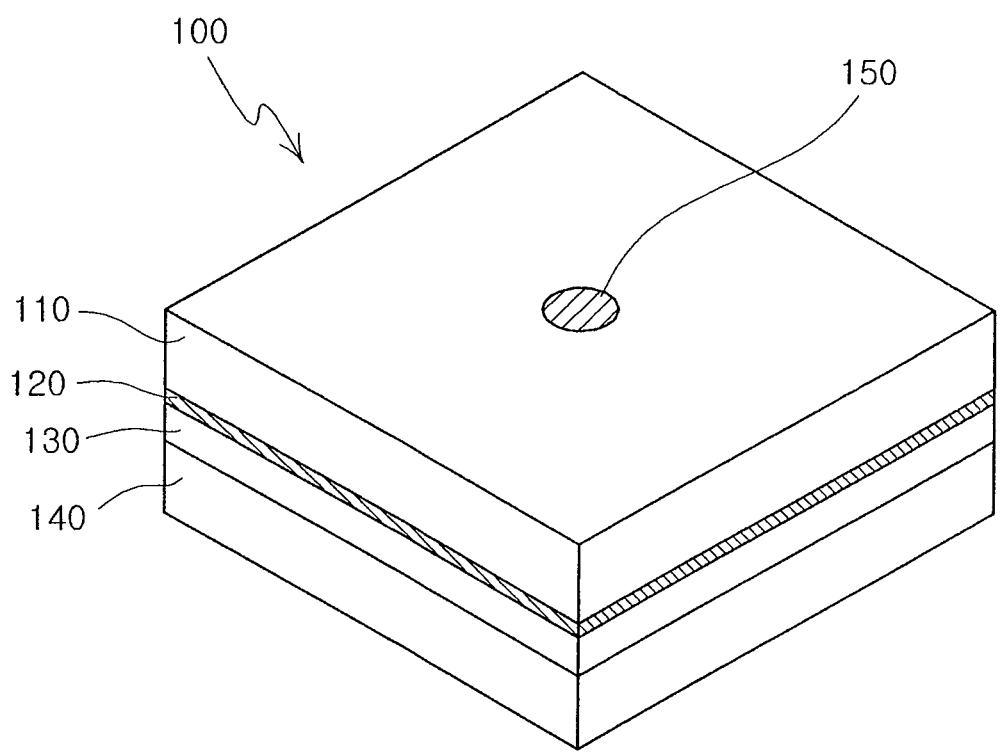
FIG. 2 is a perspective view illustrating a semiconductor light emitting device according to one exemplary embodiment of the present invention.
Figure 3A:
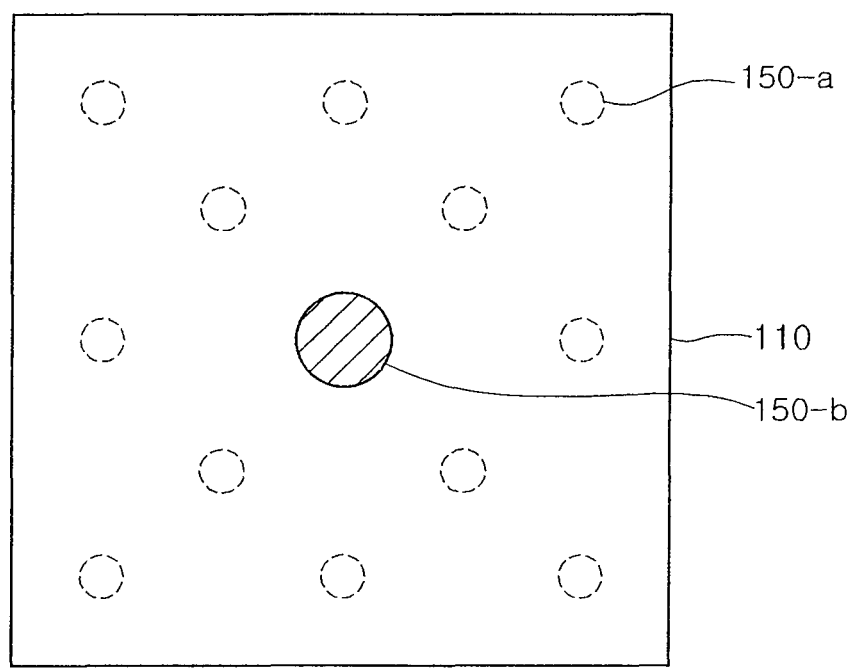
FIG. 3A is a top view illustrating the semiconductor light emitting device shown in FIG. 2.
Figure 3B:
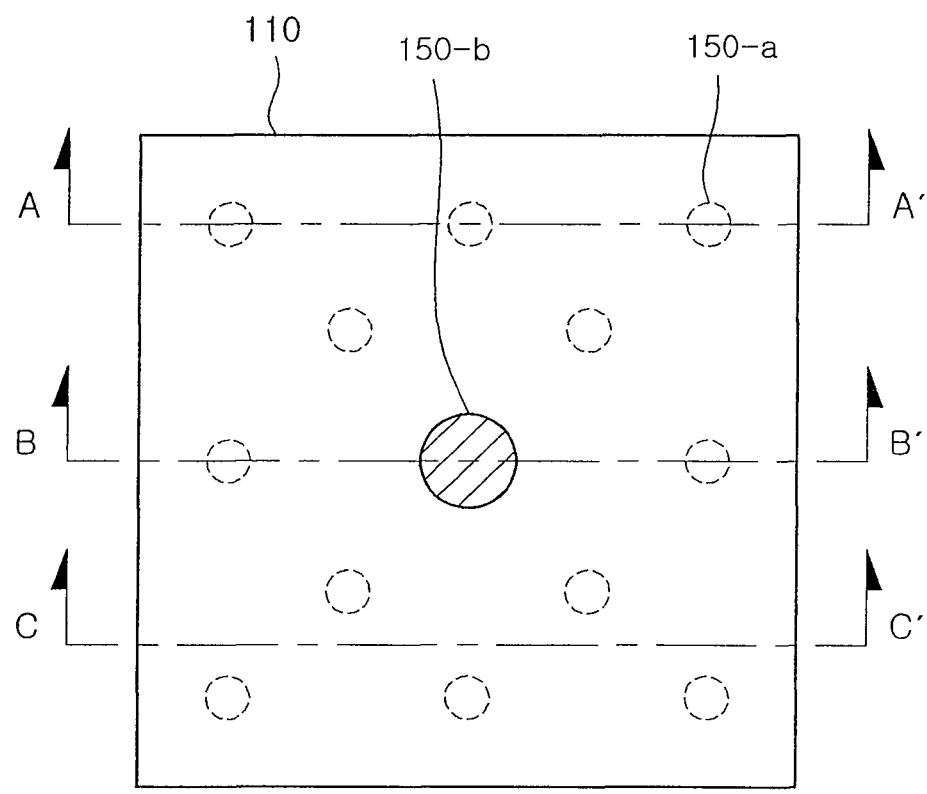
FIG. 3B is a top view illustrating the semiconductor light emitting device shown in FIG. 2.
Figure 4A:
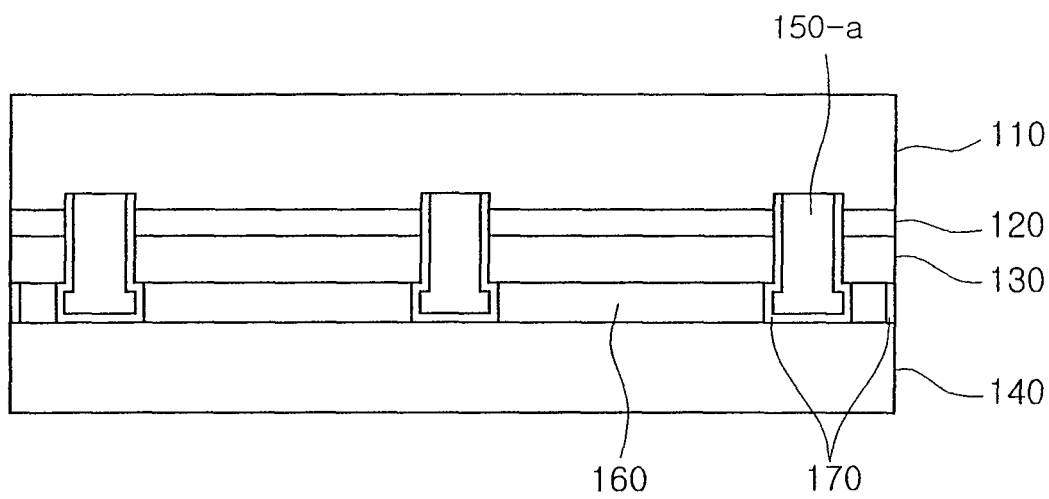
FIG. 4A is a cross-sectional view illustrating the semiconductor light emitting device, shown in FIG. 3B, taken along the line A-A'.
Figure 4B:
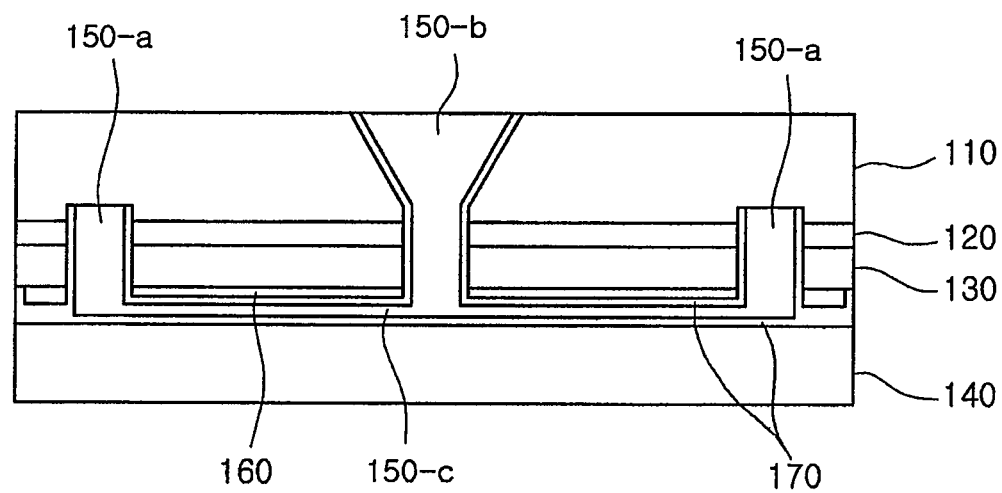
FIG. 4B is a cross-sectional view illustrating the semiconductor light emitting device, shown in FIG. 3B, taken along the line B-B'.
Figure 4C:
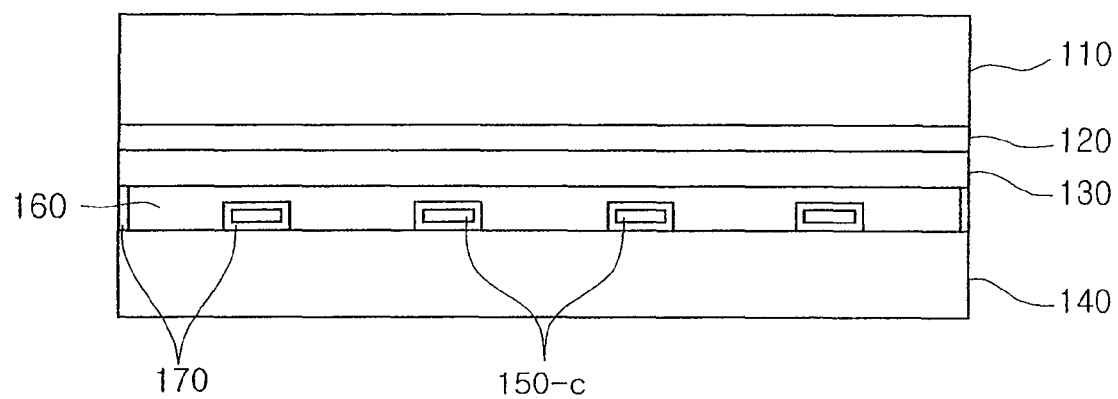
FIG. 4C is a cross-sectional view illustrating the semiconductor light emitting device, shown in FIG. 3B, taken along the line C-C'.

FIG. 2 is a cross-sectional view illustrating a semiconductor light emitting device according to one exemplary embodiment of the present invention. FIGS. 3A and 3B are top views illustrating the semiconductor light emitting device shown in FIG. 2. FIGS. 4A, 4B, and 4C are cross-sectional views illustrating the semiconductor light emitting device, shown in FIG. 3B, taken along the lines A-A', B-B', and C-C', respectively.

A semiconductor light emitting device 100 according to the exemplary embodiment of the invention includes a conductive substrate 140, a first conductivity type semiconductor layer 130, an active layer 120, and a second conductive semiconductor layer 110 that are sequentially laminated. In particular, the semiconductor light emitting device 100 according to the exemplary embodiment of the invention includes a first electrode layer 160 and a second electrode part 150. The first electrode layer 160 is formed between the conductive substrate 140 and the first conductive semiconductor layer 130. The second electrode part includes an electrode pad unit 150-$b$, an electrode extending unit 150-$a$, and an electrode connecting unit 150-$c$.

The electrode pad unit 150-$b$ extends from the first electrode layer 160 to the surface of the second conductivity type semiconductor layer 110. The electrode pad unit 150-$b$ is electrically insulated from the first electrode layer 160, the first conductivity type semiconductor layer 130, and the active layer 120. The electrode extending unit 150-$a$ extends from the first electrode layer 160 to the inside of the second conductivity type semiconductor layer 110. The electrode extending unit 150-$a$ is electrically insulated from the first electrode layer 160, the first conductivity type semiconductor layer 130, and the active layer 120. Further, the electrode connecting unit 150-$c$ is formed on the same layer as the first electrode layer and is electrically separated from the first electrode layer 160. The electrode connecting unit 150-$c$ connects the electrode pad unit 150-$b$ and the electrode extending unit 150-$a$ to each other.

The conductive substrate 140 may be a metallic substrate or a semiconductor substrate. When the conductive substrate 140 is the metallic substrate, the conductive substrate 140 may be formed of any one of metals, such as Au, Ni, Cu, and W. Further, when the conductive substrate 140 is the semiconductor substrate, the conductive substrate 140 may be formed of any one of semiconductors, Si, Ge, and GaAs. Examples of a method of forming a conductive substrate in a semiconductor light limiting device includes a plating method of forming a plating seed layer to form a substrate and a substrate bonding method of separately preparing the conductive substrate 140 and bonding the conductive substrate 140 by using a conductive adhesive, such as Au, Au—Sn, and Pb—Sr.

Each of the semiconductor layers 110 and 130 may be formed of an inorganic semiconductor, such as a GaN-based semiconductor, a ZnO-based semiconductor, a GaAs-based semiconductor, a GaP-based semiconductor, and a GaAsP-based semiconductor. The semiconductor layer may be formed by using, for example, molecular beam epitaxy (MBE). In addition, the semiconductor layers may be formed of any one of semiconductors, such as a III-V semiconductor, a II-VI semiconductor, and Si.

The active layer 120 is a layer where light emission is activated. The active layer 120 is formed of a material that has a smaller energy bandgap than each of the first conductivity type semiconductor layer 130 and the second conductivity type semiconductor layer 110. For example, when each of the first conductivity type semiconductor layer 130 and the second conductivity type semiconductor layer 110 is formed of a GaN-based compound, the active layer 120 may be formed by using a InAlGaN-based compound semiconductor that has a smaller energy bandgap than GaN. That is, the active layer 120 may include $In_xAl_yGa_{(1-x-y)}N$ ($0 \le x \le 1$, $0 \le y \le 1$, $0 \le x+y \le 1$).

In consideration of characteristics of the active layer 120, the active layer 120 is preferably not doped with impurities. A wavelength of emitted light can be controlled by adjusting a mole ratio of constituents. Therefore, the semiconductor light emitting device 100 can emit any one of infrared light, visible light, and UV light according to the characteristics of the active layer 120.

An energy well structure appears in the entire energy band diagram of the semiconductor light emitting device 100 according to the active layer 120. The electrons and the holes from the semiconductor layers 110 and 130, respectively, are moving and trapped within the energy well structure, which results in higher luminous efficiency.

The first electrode layer 160 has an electrode that electrically connects the first conductivity type semiconductor layer 130 to an external current source (not shown). The first electrode layer 160 may be formed of metal. The first electrode layer 160 may be formed of Ti as an n-type electrode, and Pd or Au as a p-type electrode.

Preferably, the first electrode layer 160 reflects light generated from the active layer 120. The emitted light moves toward a light emitting surface, thereby increasing luminous efficiency of the semiconductor light emitting device 100. In order to reflect the light generated from the active layer 120, the first electrode layer 160 is preferably formed of metals that appear white in the visible ray region. For example, the white metal may be any one of Ag, Al, and Pt. The first electrode layer 160 will be described below in more detail with reference to FIGS. 4A to 4C.

The second electrode part 150 has an electrode that electrically connects the second conductivity type semiconductor layer 110 to an external current source (not shown). The second electrode part 150 may be formed of metal. For example, the second electrode part 150 may be formed of Ti as an n-type electrode, and Pd or Au as a p-type electrode. In particular, the second electrode part 150 according to the embodiment of the invention includes the electrode pad unit 150-$b$, the electrode extending unit 150-$a$, and the electrode connecting unit 150-$c$.

Referring to FIG. 3A, the electrode pad unit 150-$b$ is formed at the surface of the second conductivity type semiconductor layer 110, and a plurality of electrode extending units 150-$a$, indicated by dashed line, are located inside the second conductivity type semiconductor layer 110.

In FIG. 3B, the top surface of the second conductivity type semiconductor layer 110, shown in FIG. 3A, is taken along the lines A-A', B-B', and C-C'. The line A-A' is determined to show a section that only includes the electrode extending units 150-$a$. The line B-B' is determined to show a section that includes the electrode pad unit 150-$b$ and the electrode extending units 150-$a$. The line C-C' is determined to show a section that does not include the electrode extending units 150-$a$ and the electrode pad unit 150-$b$.

FIGS. 4A, 4B, and 4C are cross-sectional views illustrating the semiconductor light emitting device, shown in FIG. 3B, taken along the lines A-A', B-B', and C-C', respectively. Hereinafter, a description will be made with reference to FIGS. 2, 3A, 3B, and 4A to 4C.

In FIG. 4A, each of the electrode extending units 150-$a$ extends from the first electrode layer 160 to the inside of the second conductivity type semiconductor layer 110. The electrode extending units 150-$a$ extend from the first electrode layer 160 to the second conductivity type semiconductor layer 110 through the first conductivity type semiconductor layer 130 and the active layer 120. The electrode extending units 150-*a* extend to at least part of the second conductivity type semiconductor layer 110. Contrary to the electrode pad unit 150-*b*, the electrode extending unit 150-*a* does not need to extend to the surface of the second conductivity type semiconductor layer 110. Since the electrode extending units 150-*a* are formed to spread the current in the second conductivity type semiconductor layer 110, the electrode extending units 150-*a* need to extend to the second conductivity type semiconductor layer 110.

The electrode extending unit 150-*a* needs to have a predetermined area to spread the current in the second conductivity type semiconductor layer 110. Contrary to the electrode pad unit 150-*b*, the electrode extending unit 150-*a* is not formed for an electrical connection. Therefore, the electrode extending units 150-*a* are formed by a predetermined number so that each of the electrode extending units 150-*a* has an area small enough to allow uniform current spreading in the second conductivity type semiconductor layer 110. A small number of electrode extending units 150-*a* may cause deterioration in electrical characteristics due to non-uniform current spreading. A large number of electrode extending units 150-*a* may cause a decrease in light emitting area due to difficulties in forming the electrode extending units 150-*a* and a decrease in area of the active layer. Therefore, the number of electrode extending units 150-*a* may be appropriately determined in consideration of these facts. Each of the electrode extending units 150-*a* is formed to have as small area as possible and allow uniform current spreading.

Preferably, the plurality of electrode extending units 150-*a* are formed for current spreading. Further, the electrode extending unit 150-*a* may have a cylindrical shape. A cross-section of the electrode extending unit 150-*a* may be smaller than that of the electrode pad unit 150-*b*. Further, the electrode extending unit 150-*a* is preferably separated from the electrode pad unit 150-*b* by a predetermined distance. In the first electrode layer 160, the electrode extending units 150-*a* and the electrode pad unit 150-*b* may be connected to each other by the electrode connecting unit 150-*c* to be described below. For this reason, the electrode extending units 150-*a* are separated from the electrode pad unit 150-*b* by the predetermined distance to induce uniform current spreading in the second conductivity type semiconductor layer 110.

The electrode extending units 150-*a* extend from the first electrode layer 160 to the inside of the second conductivity type semiconductor layer 110. Since the electrode extending units 150-*a* are formed to spread the current in the first conductivity type semiconductor layer 110, the electrode extending units 150-*a* need to be electrically separated from the first conductivity type semiconductor layer 130 and the active layer 120. Therefore, it is preferable that the electrode connecting units 150-*a* be electrically separated from the first electrode layer 160, the first conductivity type semiconductor layer 130, and the active layer 120. Electrical separation can be achieved by using an insulating material, such as a dielectric.

In FIG. 4B, the electrode pad unit 150-*b* extends from the first electrode layer 160 to the surface of the second conductivity type semiconductor layer 110. The electrode pad unit 150-*b* extends from the first electrode layer 160 to the surface of the second conductivity type semiconductor layer 110 through the first conductivity type semiconductor layer 130, the active layer 120, and the second conductivity type semiconductor layer 110. Particularly, the electrode pad unit 150-*b* is formed to connect the second electrode part 150 to the external current source (not shown). Preferably, the second electrode part 150 includes at least one electrode pad unit 150-*b*.

The electrode pad unit 150-*b* extends from the first electrode layer 160 to the surface of the second conductivity type semiconductor layer 110. The electrode pad unit 150-*b* formed at surface of the second conductivity type semiconductor layer 110 is electrically connected to the external current source so as to supply a current to the contact holes. Therefore, preferably, the electrode pad unit 150-*b* is electrically separated from the first electrode layer 160, the first conductivity type semiconductor layer 130, and the active layer 120. Electrical separation can be achieved by forming an insulating layer that is formed of an electrical material, such as a dielectric.

The electrode pad unit 150-*b* supplies the current to the electrode extending units 150-*a*. Further, the electrode pad unit 150-*b* is not electrically separated from the second conductivity type semiconductor layer 110 so as to directly spread the current. The electrode pad unit 150-*b* may be electrically separated from the second conductivity type semiconductor layer 110 or not according to whether current supply to the electrode extending units 150-*a* or current spreading in the second conductivity type semiconductor layer 110 is required.

A cross section of the electrode pad unit 150-*b* at the active layer 120 is preferably smaller than that of the electrode pad unit 150-*b* at the surface of the second conductivity type semiconductor layer 110. In this way, the area of the active layer 120 is ensured to the maximum extent possible to increase the luminous efficiency. However, preferably, the electrode pad unit 150-*b* at the surface of the second conductivity type semiconductor layer 110 has a predetermined area so as to connect the second electrode part 150 to the external current source (not shown).

The electrode pad unit 150-*b* may be located at the center of the semiconductor light emitting device 100. In this case, the electrode extending units 150-*a* are preferably separated from the electrode pad unit 150-*b* by the predetermined distance, and uniformly distributed. Referring to FIG. 3A, the electrode pad unit 150-*b* and the electrode extending units 150-*a* are uniformly distributed over the second conductivity type semiconductor layer 110 to optimize the current spreading. In FIG. 3A, it is assumed that there are one electrode pad unit 150-*b* and twelve electrode extending units 150-*a*. However, the number of bonding units 161 and the number of electrode extending units 150-*a* may be appropriately determined in consideration of the position of the external current source and other factors for electrical connection, and the thickness of the second conductivity type semiconductor layer 110 and other factors for current spreading.

When the plurality of electrode extending units 150-*a* are formed, the electrode pad unit 150-*b* may be directly connected to each of the plurality of electrode extending units 150-*a*. In this case, the electrode pad unit 150-*b* is formed at the center of the semiconductor light emitting device 100, and the electrode extending units 150-*a* are formed around the electrode pad unit 150-*b*. Further, the electrode connecting unit 150-*c* may directly connect the electrode pad unit 150-*b* and the electrode extending units 150-*a* in a radial direction.

Alternatively, some of the plurality of electrode extending units 150-*a* may be directly connected to the electrode pad unit 150-*b*. Other electrode extending units 150-*a* may be connected to the electrode extending units 150-*a* that are directly connected to the electrode pad unit 150-*b*, such that the electrode extending units 150-*a* are indirectly connected to the electrode pad unit 150-*b*. In this way, a larger number of electrode extending units 150-*a* can be formed to thereby increase the efficiency of current spreading.

In FIGS. 4A to 4C, the electrode connecting unit 150-c is formed in the first electrode layer 160 and connects the electrode pad unit 150-b and the electrode extending units 150-a to each other. Therefore, a considerable amount of the second electrode part 150 is located at a rear surface opposite to the direction in which light is emitted from the active layer 120, thereby increasing the luminous efficiency.

The electrode connecting unit 150-c is electrically separated from the first electrode layer 160. The second electrode part 150 and the first electrode layer 160 include electrodes that have polarities opposite from each other to supply external power to the second conductivity type semiconductor layer 110 and the first conductivity type semiconductor layer 130, respectively. Therefore, the two electrodes must be electrically separated from each other. Electrical separation can be achieved by using an insulating material, such as a dielectric.

In FIG. 4B, since the electrode pad unit 150-b is located at the surface of the second conductivity type semiconductor layer 110, it is possible to obtain characteristics of a vertical light limiting device. In FIG. 4C, since the electrode connecting unit 150-c is located in the same plane as the first electrode layer 160, it is possible to obtain characteristics of a horizontal light emitting device. Therefore, the semiconductor light emitting device 100 has a structure in which the horizontal light emitting device and the vertical light emitting device are integrated.

Referring to FIGS. 4A to 4C, the second conductivity type semiconductor layer may be an n-type semiconductor layer, and the second electrode part may be an n-type electrode part. In this case, the first conductivity type semiconductor layer 130 may be a p-type, semiconductor layer, and the first electrode layer 160 may include a p-type electrode. The second electrode part 150 includes the electrode pad unit 150-b, the electrode extending unit 150-a, and the electrode connecting unit 150-c that are connected to each other. When the second electrode part 150 includes an n-type electrode, an insulating part 170 is formed by using an insulating material to electrically separate the second electrode part 150 from the first electrode layer 160 that includes the p-type electrode.

Figure 5A:
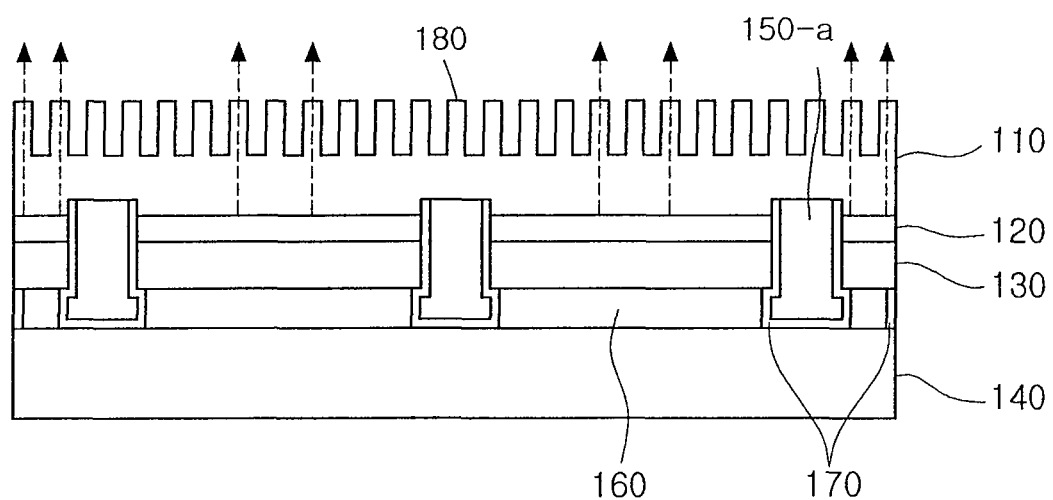
FIG. 5A is a view illustrating light emission of a semiconductor light emitting device that has an irregular pattern at a surface thereof according to another exemplary embodiment of the present invention.
Figure 5B:
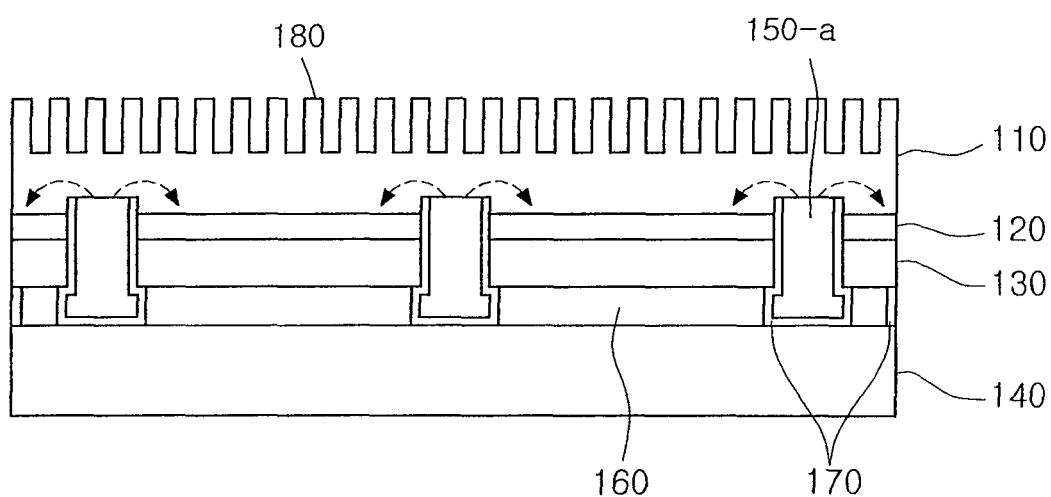
FIG. 5B is a view illustrating current spreading of the semiconductor light emitting device that has the irregular pattern at the surface thereof according to the exemplary embodiment of the present invention.

FIG. 5A is a view illustrating light emission of a semiconductor light emitting device that has an irregular pattern 180 at a surface thereof according to another exemplary embodiment of the present invention. FIG. 5B is a view illustrating the semiconductor light emitting device that has the irregular pattern 180 at the surface thereof according to another exemplary embodiment of the present invention.

A semiconductor light emitting device 100 according to the embodiment of the invention includes a second conductivity type semiconductor layer 110 that forms an uppermost surface in a direction where emitted light moves. It is easy to form an irregular pattern on the surface by using a well-known method, such as photolithography. In this case, light emitted from an active layer 120 passes through the irregular pattern 180 that is formed on the second conductivity type semiconductor layer 110, and then the light is extracted. The irregular pattern 180 increases light extraction efficiency.

The irregular pattern 180 may have a photonic crystal structure. Photonic crystals contain different media that are regularly arranged like crystals. The photonic crystals can increase light extraction efficiency by controlling light in unit of length corresponding to a multiple of a wavelength of light. The photonic crystal structure may be formed according to an appropriate process after forming the second conductivity type semiconductor layer 110 and a second electrode part 150. For example, the photonic crystal structure may be formed by an etching process.

Even though the irregular pattern 180 is formed on the second conductivity type semiconductor layer 110, it does not affect the current spreading. Referring to FIG. 5B, current spreading by the electrode extending units 150-a is not affected by the irregular pattern 180. Each of the electrode extending units 150-a spreads the current below the irregular pattern 180, and the irregular pattern 180 extracts the emitted light to increase the light emitting efficiency.

Table 1 shows light emitting area, current density, luminous efficiency of a semiconductor light emitting device.

TABLE 1

| Light emitting area (cm$^2$) | Current density (A/cm$^2$) | Luminous efficiency (lm/W) | Improvement (%) |
|---|---|---|---|
| 0.0056 | 62.5 | 46.9 | 100 |
| 0.0070 | 50.0 | 51.5 | 110 |
| 0.0075 | 46.7 | 52.9 | 113 |
| 0.0080 | 43.8 | 54.1 | 115 |

The larger light emitting area, the higher luminous efficiency. However, in order to ensure the light emitting area, the area of the formed electrodes needs to be reduced. Therefore, current density of the light emitting surface is likely to decrease. However, the decrease in current density of the light emitting surface may deteriorate electrical characteristics of the semiconductor light emitting device.

However, the above problem can be solved by achieving current spreading by using electrode connecting units. Therefore, the problem of the deterioration in the electrical characteristics that is caused due to the decrease in current density can be solved by a method of forming the electrode extending units that do not extend to the light emitting surface but are formed therein so as to perform current spreading. Therefore, the semiconductor light emitting device according to the embodiment of the invention achieves desired current spreading and desired luminous efficiency by ensuring the maximum light emitting area.

As set forth above, according to exemplary embodiments of the invention, the semiconductor light emitting device forms an electrode structure on a semiconductor layer below an active layer except for part of the electrode structure that is formed at a light emitting surface. Therefore, emitted light can be prevented from being reflected or absorbed by the electrode structure. Further, the maximum light emitting area can be ensured to thereby maximize luminous efficiency.

Further, since the electrode structure has at least one electrode pad unit and at least one electrode extending unit in order to facilitate current spreading, uniform current spreading can be achieved by the electrode structure having a small area.

Further, since the electrode pad unit is located at an upper surface of the semiconductor light emitting device, alignment is unnecessary during die bonding, and wire bonding is also facilitated. Therefore, mass production can be achieved at low cost.

Therefore, according to the embodiments of the invention, a semiconductor light emitting device that has high reliability and high mass production can be realized.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device having a conductive substrate, a first conductivity type semiconductor layer, an active layer, and a second conductivity type semiconductor layer disposed in that order, the semiconductor light emitting device comprising:
   a first electrode layer disposed between the conductive substrate and the first conductivity type semiconductor layer and electrically connected to the conductive substrate;
   at least one via penetrating through the first electrode layer, the first conductivity type semiconductor layer, the active layer and the second conductivity type semiconductor layer;
   a second electrode layer having:
      a first portion extending in parallel with the first electrode layer and having a top surface facing the first electrode layer and a bottom surface facing the conductive substrate, and
      a second portion extending, through inside of the at least one via, from an area between the conductive substrate and the first conductivity type semiconductor layer to an area of the second conductivity type semiconductor layer, the second portion filling all the inside of the at least one via, the first portion and the second portion being connected with each other; and
   an insulating part disposed between the second electrode layer and each of the first electrode layer, the first conductivity type semiconductor layer, the active layer, and the conductive substrate, the insulating part electrically insulating the second electrode layer from the conductive substrate.

2. The semiconductor light emitting device of claim 1, wherein an upper portion of the at least one via is covered with the second conductivity type semiconductor layer.

3. The semiconductor light emitting device of claim 1, wherein the first electrode layer reflects light generated from the active layer.

4. The semiconductor light emitting device of claim 3, wherein the first electrode layer includes one selected from a group consisting of Ag, Al, and Pt.

5. The semiconductor light emitting device of claim 1, wherein each of the first conductivity type semiconductor layer and the second conductivity type semiconductor layer is formed of a GaN-based compound semiconductor.

6. The semiconductor light emitting device of claim 1, wherein the active layer is formed of a $In_xAl_yGa_{(1-x-y)}N$ (here, $0 \leq x \leq 1$, $0 \leq y \leq 1$, and $0 \leq x+y \leq 1$) based compound semiconductor.

7. The semiconductor light emitting device of claim 1, wherein an irregular pattern is disposed on the second conductivity type semiconductor layer.

8. The semiconductor light emitting device of claim 1, wherein the second conductivity type semiconductor layer has a photonic crystal structure.

9. The semiconductor light emitting device of claim 1, wherein the conductive substrate is a metallic substrate.

10. The semiconductor light emitting device of claim 9, wherein the metallic substrate includes one selected from a group consisting of Au, Ni, Cu, and W.

11. The semiconductor light emitting device of claim 1, wherein the conductive substrate is a semiconductor substrate.

12. The semiconductor light emitting device of claim 11, wherein the semiconductor substrate includes one selected from a group consisting of Si, Ge, and GaAs.

13. The semiconductor light emitting device of claim 1, wherein the first electrode layer surrounds the top surface and side surfaces of the first portion of the second electrode layer.

14. The semiconductor light emitting device of claim 1, wherein the insulating part contacts the top surface and the bottom surface of the first portion of the second electrode layer.

15. The semiconductor light emitting device of claim 1,
   wherein the at least one via comprises a plurality of vias penetrating through the first electrode layer, the first conductivity type semiconductor layer, the active layer and the second conductivity type semiconductor layer, and
   wherein the second electrode layer further comprises a third portion extending, through an inside of one of the plurality of vias, from the first portion of the second electrode layer to a top surface of the second conductivity type semiconductor layer.

* * * * *